United States Patent [19]

McIntyre

[11] Patent Number: 5,652,721
[45] Date of Patent: Jul. 29, 1997

[54] TESTING AN INTEGRATED CIRCUIT DEVICE

[75] Inventor: David Hugh McIntyre, Bristol, United Kingdom

[73] Assignee: SGS-Thomson Microelectronics Limited, Bristol, United Kingdom

[21] Appl. No.: 517,725

[22] Filed: Aug. 21, 1995

[30] Foreign Application Priority Data

Aug. 26, 1994 [GB] United Kingdom ............... 9417268

[51] Int. Cl.$^6$ ............................................. G11C 17/00
[52] U.S. Cl. ............................... 365/185.18; 365/201
[58] Field of Search ................... 365/185.18, 185.09, 365/185.33, 201, 230.02, 189.02, 230.03

[56] References Cited

U.S. PATENT DOCUMENTS

| 5,206,583 | 4/1993 | Dawson et al. | 365/225.7 |
| 5,233,566 | 8/1993 | Imamiya et al. | 365/230 |

FOREIGN PATENT DOCUMENTS

| 0 420 388 | 4/1991 | European Pat. Off. | G01R 31/31 |
| 0 528 744 | 2/1993 | European Pat. Off. | G06F 11/20 |

Primary Examiner—Tan T. Nguyen
Attorney, Agent, or Firm—Wolf, Greenfield & Sacks, P.C.; James H. Morris

[57] ABSTRACT

An integrated circuit device has a set of storage elements which are not reprogrammable or which are slow to reprogram and, associated with each storage element, a latch. With each storage element and latch there is associated a switch circuit which can either be connected to supply as an output a signal from the storage element or from the latch. In a test mode, the latches hold test data bits for testing the device and the switch circuits are operated to supply control signals from the test data bits. In a normal mode, the switch circuits are operated to supply control signals from the storage elements. The integrated circuit device includes functional circuitry which takes the form of programming circuitry for programming the storage elements responsive to the control signals.

27 Claims, 5 Drawing Sheets

TESTING AN INTEGRATED CIRCUIT DEVICE

FIELD OF THE INVENTION

This invention relates to testing an integrated circuit device, and in particular to testing an IC device which includes elements which can be programmed once but which cannot be reprogrammed or which are slow or awkward to reprogram. The invention concerns a method for testing such a device and a novel IC structure for implementing the test.

The invention is particularly but not exclusively concerned with integrated circuit semiconductor memory devices.

BACKGROUND TO THE INVENTION

The present invention can be applied to any appropriate device, and is not restricted to any specific structure of device. However, the invention has particular advantage in a flash EPROM which includes electrically reprogrammable single transistor cells with a floating gate, and a plurality of non-reprogrammable elements or UPROM elements. The invention can also be applied where the UPROM elements can be reprogrammed but only by a slow or awkward process.

UPROM cells are used on flash EPROMs (erasable programmable read only memories) to store redundancy information. Bits can also be used to alter a chip's functionality, either to enable optional functionality or to trim analogue voltages or timings. This "trimming" can help to make the chip more tolerant of manufacturing variations. In current memory devices, the UPROM cells are programmed using a test mode by appropriately setting voltages using a program circuit. However, once a bit has been programmed into a UPROM cell, it is not possible to erase it, except possibly by erasing flash transistors used in the UPROM cell, but this is undesirable during testing as this programming and erasing would take a significant amount of time. Thus, it is not possible with existing memory devices to "try out" a trim setting before programming it to its final value.

It would be desirable and it is sometimes necessary to program an option setting early in a test flow because the options affect the results of other tests. However, it is also desirable to allow the choice of trim options to be changed later, perhaps as a result of later tests or tests at another temperature. Also, some of the option bits may affect circuits used during programming of the UPROM cells themselves, in which case it is desirable to be able to use any desired setting during this operation, even though the UPROM cells have obviously not been programmed by this time.

SUMMARY OF THE INVENTION

According to one aspect of the present invention there is provided an integrated circuit device comprising:

functional circuitry controllable in response to control signals;

a plurality of storage elements which are not reprogrammable or which are slow to reprogram;

a set of latches, each latch in the set being associated respectively with each storage element of a set of the plurality of storage elements for holding respective test data bits; and a set of switch circuits, each switch circuit connected to a respective one of said set of storage elements and to its associated latch and selectively operable to supply as an output a signal from one of the storage element and the latch to which it is connected, whereby, in use in a test mode, the latches hold test data bits for testing the device, the switch circuit being operated to supply said control signals from said test data bits and, in use in a normal mode, the switch circuits are operated to supply said control signals from said storage elements;

wherein said functional circuitry includes programming circuitry for programming the storage elements.

The invention is particularly applicable to an integrated circuit device wherein said functional circuitry includes an array of reprogrammable memory cells, the storage elements being non-reprogrammable or slow to reprogram relative to the reprogrammable memory cells.

The programming circuitry can also be used for programming the reprogrammable memory cells. For that purpose, it can include a plurality of programmable load circuits for supplying programming signals; and a program controller circuit responsive to said control signals for determining the programming signals to be supplied by the programmable load circuits.

In the described embodiment, a first set of programmable load circuits supplies programming signals to the storage elements and to the reprogrammable memory cells and a second set supplies programming signals only to the reprogrammable memory cells.

The programmable load circuits can be arranged differently. In one alternative, a first set of programmable load circuits is dedicated to supply programming signals to the storage elements and a second set of programmable load circuits is dedicated to supply programming signals to the reprogrammable memory cells. In a second alternative, all of the programmable load circuits are shared, that is they supply programming signals both to the storage elements and to the reprogrammable memory cells. In a third alternative, a first set of the programmable load circuits is shared, and a second set is arranged to supply programming signals only to the storage element. In a still further alternative, a set of the programmable load circuits is shared, one set is dedicated to the reprogrammable memory cells and another set is dedicated to the storage elements.

The functional circuitry can include clock circuitry for supplying a clock signal for operation of the program control circuit, the frequency of the clock signal being controlled by the control signals.

The functional circuitry can also include voltage supply circuitry for supplying an appropriate analogue voltage for operation of the integrated circuit device, the analogue voltage being determined by the control signals.

The voltage supply circuitry can comprise a source voltage switch for selectively supplying an appropriate voltage to the sources of transistors within the memory array. Alternatively or additionally, it can comprise a programming voltage reference circuit for selectively supplying a reference voltage for programming.

Thus, in another aspect the invention provides a memory comprising:

a first plurality of reprogrammable memory cells;

a second plurality of electrically reprogrammable memory cells which are slow to reprogram relative to the reprogrammable memory cells;

a set of latches, each latch in the set being associated respectively with each of a set of the second plurality of memory cells;

a set of switch circuits, each switch circuit connected to a respective one of said set of memory cells and to its associated latch and selectively operable to supply as an output a signal from one of the memory cell and the latch to which it is connected whereby, in use in a test mode, the latches hold test data bits for testing the memory, the switch circuit being operated to output said test data bits and, in use in a normal mode, the switch circuits are operated to output data bits from said set of memory cells.

As already explained above, the memory cells which are not reprogrammable or which are slow to reprogram are referred to herein as UPROM cells. The provision of a latch associated with each UPROM cell allows test data bits to be used for testing and for setting a final "trim". Once a satisfactory test has been carried out, the UPROM cells can be programmed in accordance with the test data bits for that test which were held in the latches. This dramatically enhances the options available for testing a memory device.

In the described embodiment, each of the first plurality of reprogrammable memory cells is a single transistor with a floating gate which is electrically erasable and reprogrammable.

The invention provides in a further aspect a method of testing an integrated circuit device comprising functional circuitry controllable in response to control signals and a plurality of storage elements which are not reprogrammable or which are slow to reprogram, the method comprising:

loading test data bits respectively into each of a set of latches, each latch being associated with a respective one of a set of the plurality of storage elements;

selecting a test mode in which the outputs of the latches provide the control signals for testing the memory;

on completion of a satisfactory test, programing the storage elements in accordance with the test data bits which were held in the latches during the satisfactory test; and selecting a normal mode of operation in which the storage elements provide the control signals, wherein the functional circuitry includes programing circuitry for programming the storage elements.

The invention also provides a method of testing a memory comprising a first plurality of reprogrammable memory cells and a second plurality of electrically reprogrammable memory cells which are slow to reprogram relative to the reprogrammable memory cells, the method comprising:

loading test data bits respectively into each of a set of latches, each latch being associated with a respective one of a set of the second plurality of memory cells;

selecting a test mode in which the outputs of the latches provide the test signal outputs for testing the memory;

on completion of a satisfactory test, programing a second plurality of memory cells with the test data bits which were held in the latches during the satisfactory test; and selecting a normal mode of operation in which the outputs of the second plurality of memory cells provide control signals for the memory.

For a better understanding of the invention and to show how the same may be carried into effect, reference will now be made by way of example to the accompanying drawings.

DESCRIPTION OF THE PREFERRED EMBODIMENTS

The present invention can be applied to any appropriate integrated circuit device with non-reprogrammable or hard to reprogram storage elements. However, the invention has particular advantage in a flash memory having reprogrammable single transistor cells with a floating gate and separate UPROM cells. The basic principle of operation of one type of flash memory will be described hereinbelow with reference to a specific illustrative example.

Figure 1:
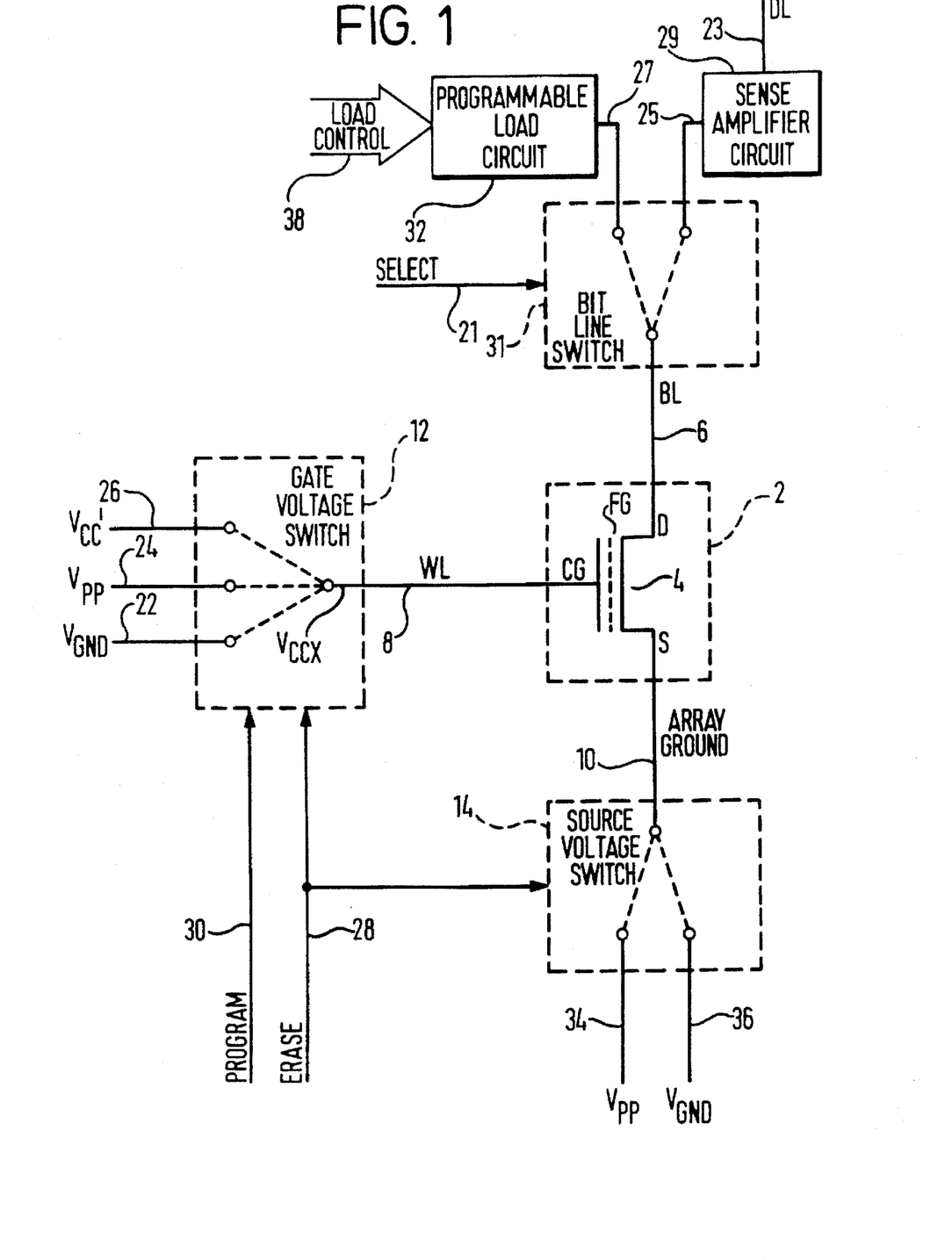
FIG. 1 is a schematic diagram showing operation of a floating gate flash memory cell.

FIG. 1 illustrates a flash memory cell 2 comprising a single floating gate transistor 4 having a control gate CG, a source S, and a drain D. The source S of the floating gate transistor 4 is connected to an ARRAY GROUND signal on line 10. Through a source voltage switch circuit 14 this line 10 can be at a ground voltage VGND or a high voltage Vpp. Voltage Vpp represents a programing potential (typically 12 V) and voltage VGND represents device ground. Vpp is normally connected to array ground via a resistor (not shown). The source voltage switch 14 is connected to the voltage Vpp via line 34 and the voltage VGND via line 36. The control gate CG of the floating gate transistor 4 is connected to a gate voltage switch 12 by a word line (WL) 8 through a row decoder circuit not shown in FIG. 1. The gate voltage switch 12 is further connected to voltages Vcc', Vpp and VGND on lines 26, 24 and 22 respectively. Vcc' is at 5 V for a 5 V part or is boosted to about 5 V (or above 4 V) for a 3 V part. These switches 14 and 12 each receive a control signal ERASE on line 28 and additionally the gate voltage switch 12 receives a control signal PROGRAM on line 30. The drain D of the floating gate transistor 4 is connected to a bit line switch 31 by a bit line (BL) 6. The bit line switch is further connected to the input of a programmable load circuit 32 on line 27 and the input of a sense amplifier circuit 29 on line 25. The output of the sense amplifier circuit 29 on line 23 forms a data line (DL). The switch 31 receives a control signal SELECT on line 21. The programmable load circuit 32 receives load control signals on lines 38.

The flash memory has three modes of operation: program, erase and read. Each of these modes will be described hereinafter with reference to FIG. 1. The program mode involves writing a "0" to a memory cell or group of memory cells, the erase mode involves storing "1"s and the read mode involves reading a cell to establish whether it is programmed or erased, i.e. contains either a "0" or a "1".

During a program mode, the control signal PROGRAM on line 30 is set such that the gate voltage switch 12 is configured to connect the voltage Vpp on line 24 to the control gate CG of transistor 4 via word line 8. As the control signal ERASE on line 28 is not set the source voltage switch 14 is configured to connect the voltage VGND on line 36 to the source of transistor 4 via the ARRAY GROUND signal line 10. The control signal SELECT on line 21 is set such that the bit line on line 6 is connected to the programmable load 32 by line 27. The load control signals 38 are set such that the programmable load 32 is controlled such that a voltage of about 5 V is on the drain D of the transistor 4 via the bit line 6. As a result of these signals applied to the transistor 4, the floating gate becomes negatively charged. The negative charge shifts the threshold voltage of the floating gate transistor making it less conductive. The amount of negative charge accumulated at the floating gate depends on the duration for which the control signal PROGRAM is set. In this way, a "0" is written into the cell. Normally, several program pulses may be needed, each pulse being followed by a verify cycle.

During an erase mode, the control signal ERASE on line 28 is set such that the gate voltage switch 12 is configured to connect the voltage VGND on line 22 to the control gate CG of the transistor 4 via the word line 8, and such that the switch 14 is configured to connect the voltage Vpp on line 34 to the source S of the transistor 4 via the ARRAY GROUND line 10. The control signal SELECT on line 21 is again set such that the bit line 6 is disconnected so that it floats. As the floating gate transistor is fabricated such that the source region in the substrate underlies the floating gate, any negative charge on the floating gate will be reduced. The amount of negative charge removed from the floating gate depends on the duration for which the ERASE signal on line 28 is set. The reduction of negative charge shifts the threshold voltage of the floating gate transistor making it more conductive. In this way the state of the cell is restored to "1". Normally, several erase pulses are required, each erase pulse being followed by a verify cycle.

During a read mode, neither the control signal ERASE on line 28 nor the control signal PROGRAM on line 30 are set. Consequently, the Vcc' signal on line 26 is connected by the source voltage switch 12 to the control gate of the transistor 4 via the word line S and the voltage VGND on line 36 is connected to the source of the transistor 4 via the ARRAY GROUND signal line 10. The bit line 6 is biased to approximately 1 volt prior to a read operation by a bit line load (not shown) within the sense amplifying circuit. During a read operation, for an erased cell (with "1" stored in it) the conductivity of the cell is such that current passes through the cell when the bit line is connected for sensing. For a programmed cell (with a "0" stored in it) substantially no current passes through the cell. The current passed by the cell is compared with a reference current to detect the status of the cell.

The operation of a flash cell in a memory array will now be described with reference to FIG. 2. Signal lines or circuitry common to FIG. 1 can be identified in FIG. 1 by use of the same reference numerals. Voltage supplies have not been illustrated in FIG. 2 for reasons of clarity, but it will be understood with reference to FIG. 1 which voltages are required in various parts of the circuit.

Figure 2:
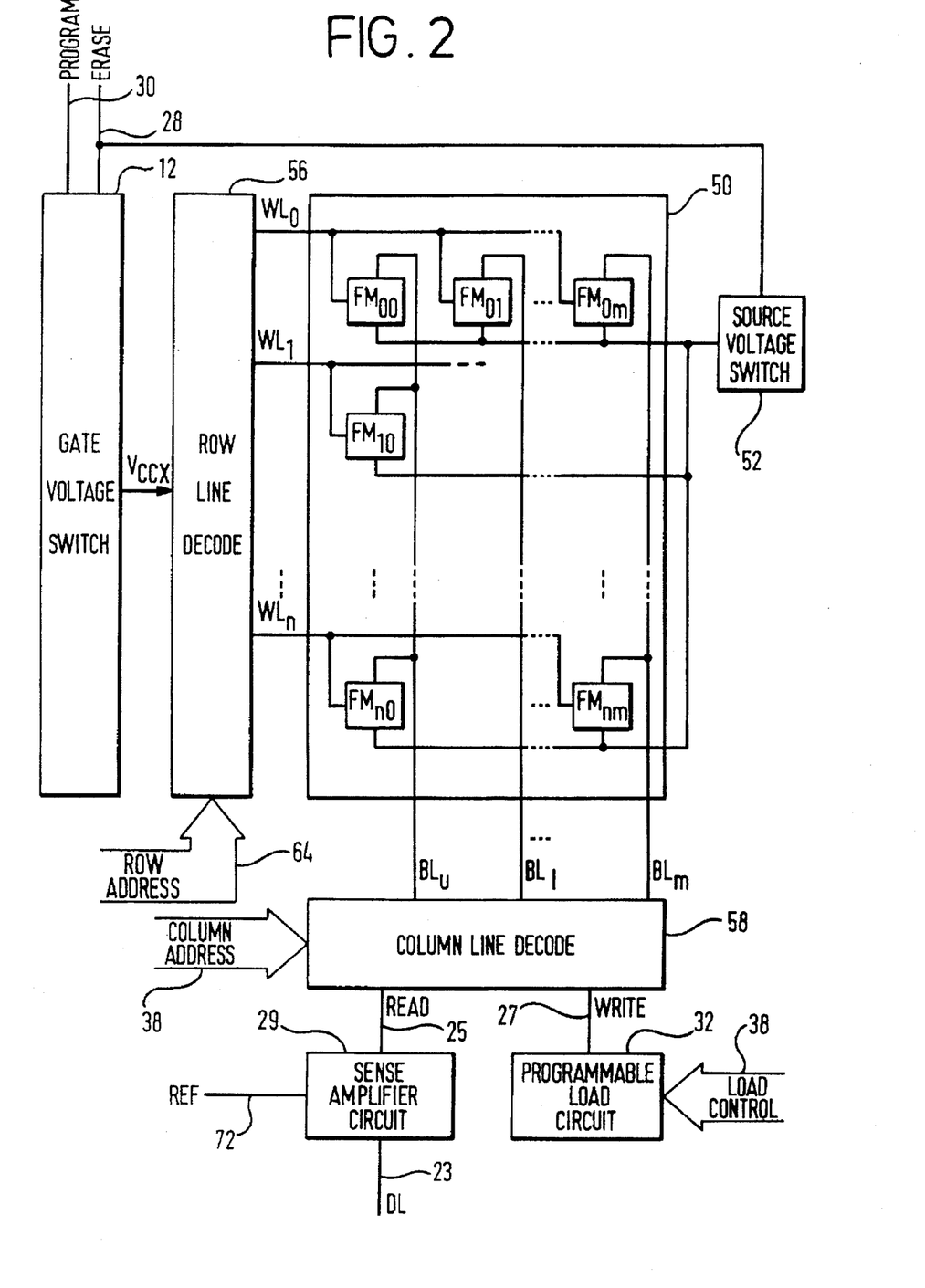
FIG. 2 is a schematic diagram showing a memory array.

FIG. 2 illustrates a flash memory array 50 comprising a plurality of flash memory cells FMoo ... FMnm, arranged in rows and columns, each of which can be the same as the cell 2 shown in FIG. 1. The gates of the transistors in each memory cell in a row are commonly connected to a respective word line WLo ... WLn addressable by a row line decode circuit 56 which receives the row address 64. The gate voltage switch 12 responds to the control signals PROGRAM and ERASE on line 30 and 28 respectively, and supplies the appropriate gate voltage Vccx on line 29 to be switched to the addressed wordline through the row decode circuit 56.

The drains of each transistor in a column are commonly connected by bit lines BLo ... BLm to a column line decode circuit 58. The column line decode circuit can be considered as a plurality m of the bit line switch circuits 31, with the SELECT signal being generated responsive to the column address 38. The output of the column line decode circuit 58 on line 25 is a read output and is connected to the sense amplifier circuit 29. The column line decode circuit receives a write input on line 27 from the programmable load circuit 32. The programmable load circuit is controlled by the load control signals 38. During a program or erase operation the bit lines BLo to BLm are selectively connected to the programmable load circuit 32. During a read operation the selected bit line (or bit lines) is connected to the sense amplifier circuit 29. The sense amplifier circuit 29 also receives a reference signal REF on line 72 and generates an output signal on the data line (DL) on line 23.

It will be appreciated that when a particular cell is chosen to be programmed, the programing load will only be applied to a selected column so that other cells in the same row as the selected cell are not inadvertently programmed. In addition in general during read and program operations it is desirable to apply certain signals to cells in the array which have not been selected to improve the performance of the cell, as is well known in the art. During an erase operation every cell in the memory array is erased, although it will be appreciated by a person skilled in the art that an array could be split into sectors for erasing so that only part of the array is erased at any one time.

Figure 3:
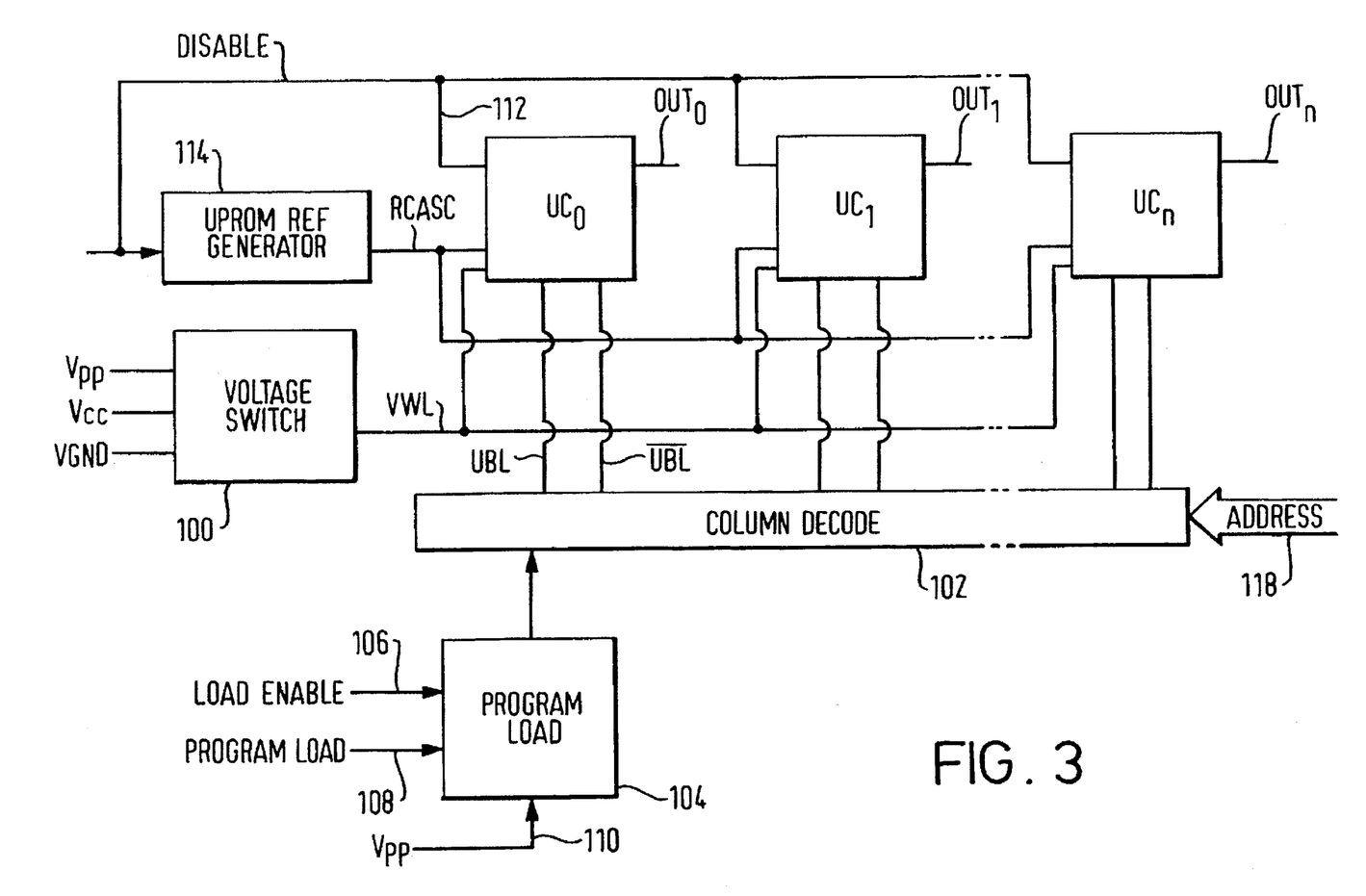
FIG. 3 is a schematic diagram showing UPROM cells of a memory array.
Figure 4:
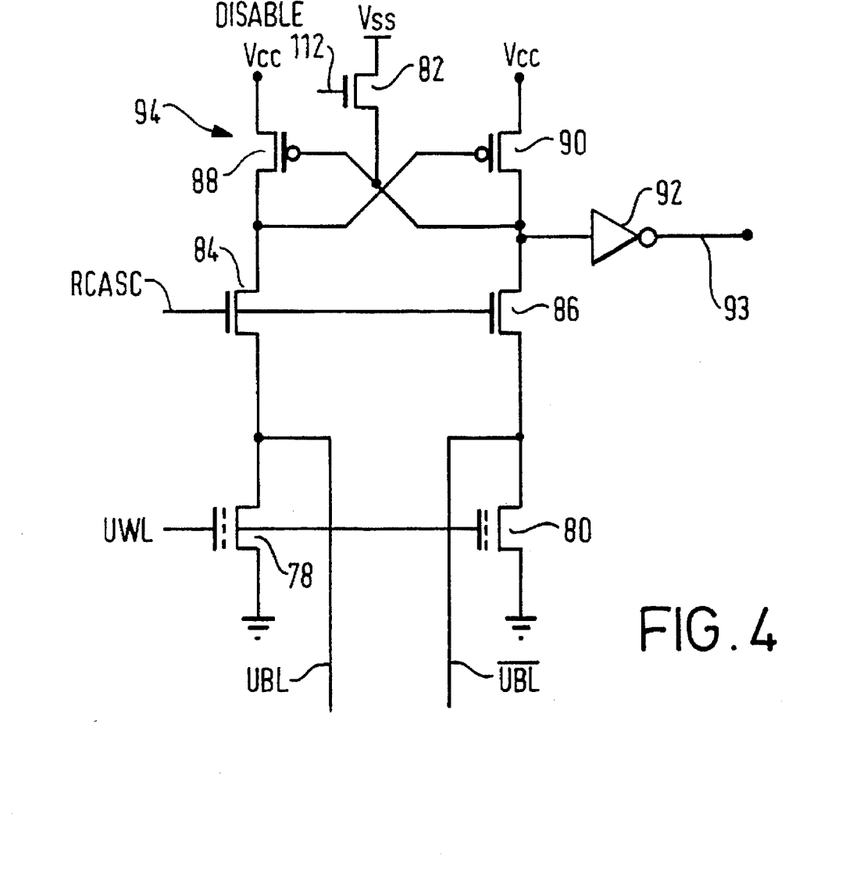
FIG. 4 is a transistor level diagram of one implementation of a UPROM cell.

The flash memory array 50 also includes a plurality of UPROM cells UC0 ... UCn, as shown in FIG. 3. A single row of UPROM cells is shown in FIG. 3 but it will be appreciated that any number of UPROM cells could be provided in accordance with requirements. Where there is more than one row, a row decode for the UPROM cells will be required. These UPROM cells differ from the flash memory cells FC00 ... FCnm in that they comprise a more complex arrangement of transistors than the single floating gate transistor which constitutes a flash memory cell and in that, once they have been programmed, they cannot be reprogrammed either at all or easily. One example of a UPROM element is shown in FIG. 4. The UPROM element 94 shown in FIG. 4 comprises first and second floating gate transistors 78,80. These transistors can be as shown in FIG. 1 and operate in a similar manner. The sources of the transistors 78,80 are both connected to ground (VGND). There is no need to connect them to a source voltage switch for selectively connecting them to Vpp as in FIG. 1, because these transistors are not intended to be erased and reprogrammed after initial programming, although this could be done if desired. The gates of the transistors are connected to a UPROM wordline UWL, which is connected to a voltage switch 100 for selectively connecting the wordline UWL to Vpp, Vcc or VGND. The voltage input marked Vpp in FIG. 3 could be connected to the voltage Vccx in FIG. 2 if desired. The drains of the transistors are connected to the bit lines UBL,$\overline{UBL}$ for the cell. As shown in FIG. 3, the UPROM bit lines UBL0,$\overline{UBL0}$, UBL1,$\overline{UBL1}$ ... UBLn, $\overline{UBLn}$ are connected to a UPROM column decode circuit 102 through which a programming voltage is selectively connected to the bit lines from a programmable load 104. The programmable load 104 receives load enable and program load signals on lines 106,108 and the higher supply voltage Vpp on line 110. This programming load circuit 104 acts to apply to the drains of the transistors 78,80 voltages to program one of the flash transistors using programming voltage levels discussed earlier. The drains of the flash transistors 78,80 are connected through switch transistors 84,86 to a pair of p-channel cross-coupled transistors 88,90 which cooperate to remove DC current in a known manner when the cell is programmed, These cross-coupled transistors in turn are connected to the power supply voltage VCC.

The output 93 of the UPROM element 94 is taken between the transistor 90 and the switchable transistor 86 via an inverter 92. In a known memory, this output 93 is then supplied to other parts of the memory in a known fashion.

The UPROM element 94 also includes an isolation transistor 82 which receives a disable signal on line 112. During programming, the disable signal is active so that the switch transistors 84,86 are off and the isolation transistor is on, in order to isolate the pair of p-channel cross-coupled transistors 88,90 from the high voltages used during programming. The switch transistors 84,86 receive a control signal RCASC from a UPROM reference generator circuit 114.

In the UPROM element of FIG. 4, exactly one of the flash transistors 78,80 is normally programmed, so that the output will settle at a proper CMOS level and no d.c. current is consumed by the cell, as is well known in the art.

A UPROM cell is selected for programming using the column decode circuit 102 which receives an address 118. This address can be provided by a subset of the address bits which are used to address the main memory array shown in FIG. 2. The programmable load 104 contains a plurality of program loads, each program load being connected to a respective bit line of selected UPROM cells. In the described implementation, these are the same program loads that are used for programming the normal array 50, although different ones could be used if desired.

It is to be noted that it is not necessary to use a "column address" to address the UPROM cells, any suitable address bits could be used to control the column decode circuit.

Figure 5:
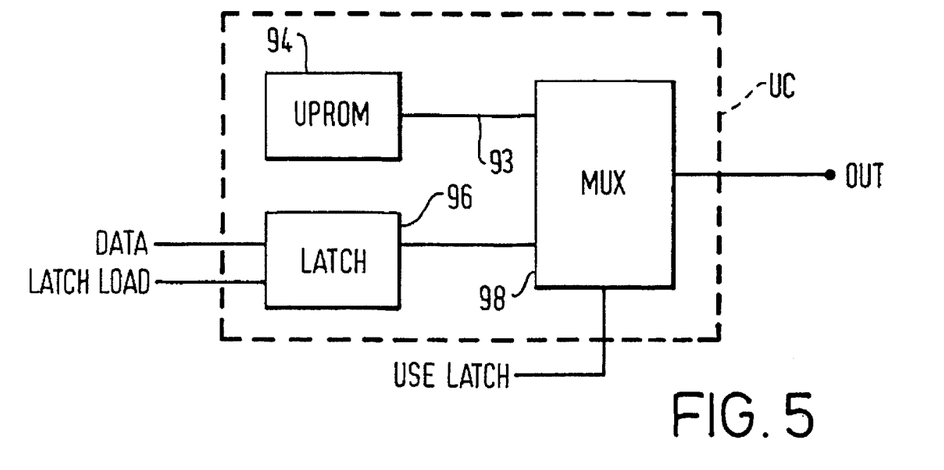
FIG. 5 represents in block diagram form the arrangement of the UPROM cells.

The present invention differs from the prior art in that each UPROM cell $UC_0 \ldots UC_n$ shown in FIG. 2 has the construction shown in block diagram in FIG. 5. That is, it comprises a conventional UPROM element of the type shown in FIG. 4 for example which is denoted by reference numeral 94 in FIG. 5 and entitled UPROM. There is provided in parallel with this UPROM element a latch 96. The output of the UPROM element on line 93 and the output of the latch 96 are supplied to a multiplexor 98 which selectively switches one of the output of the UPROM element 94 and the latch 96 to provide output signals $OUT_0 \ldots OUT_n$ (FIG. 3).

The outputs $OUT_0 \ldots OUT_n$ of the UPROM cells are used as signals for controlling other parts of the memory.

In the described embodiment, the control signals affect the following:

i) Trimming the analogue voltage applied to the drain of flash EPROM transistors during programming, including the drain of flash transistors in the UPROM cells when they are being programmed.

ii) Trimming the resistance through which the analogue voltage is applied to the source of all the flash EPROM transistors in the array or in one of the sectors of the array during erasure. This does not affect the erasure of the UPROM transistors.

iii) Trimming the frequency of the on-board program/erase clock. This is used for controlling an internal state machine, used for all program/erase/verify operations, including program/erase operations on the UPROMs. This clock is not used for read operations of the main array or the UPROMs.

iv) Trimming the delay between address/chip-enable transitions (or equivalent events generated by an internal state maching) and the triggering of the internal sense clock signal, which clocks the dynamic sense amplifier 29. This option does not affect the operation of the UPROMs.

v) To control if the internal state machine will accept "CPU" or "embedded" program/erase commands. To perform a program/erase operation in "embedded" mode, the user just loads the command, and the state machine will automatically sequence through all of the needed internal steps. In "CPU" mode, however, a controlling CPU must control the programming (or erase) operation itself, generally by loading a command to perform one program pulse, then waiting for the pulse to be performed, then loading a verify command and checking the result. The CPU then needs to check if the resulting data is correct, and repeat the operation if not. During a test, the CPU mode gives more diagnostic information which can be useful during testing. To the extent that these program commands are used to program the UPROMs, this also affects programming of the UPROMs. However, this test mode scheme means that the test program can always use one of the two schemes outlined above, rather than having to write a test program to cope with both. Also, without the latches, if these options were programmed first it might then be necessary to use a different program command to program the other options and/or redundancy.

vi) To control the Vcc operation range. This is used to program a Vcc detect circuit to operate at a nominal Vcc of 5 V, 3.3 V, or an "autodetect" mode which will allow the chip to detect the supply voltage and select the appropriate mode (5 V or 3.3 V).

vii) Finally, there are two on/off options affecting optional functionality, to allow evaluation as to whether the device performs better with or without this functionality. This does not affect the UPROMs.

Figure 6:
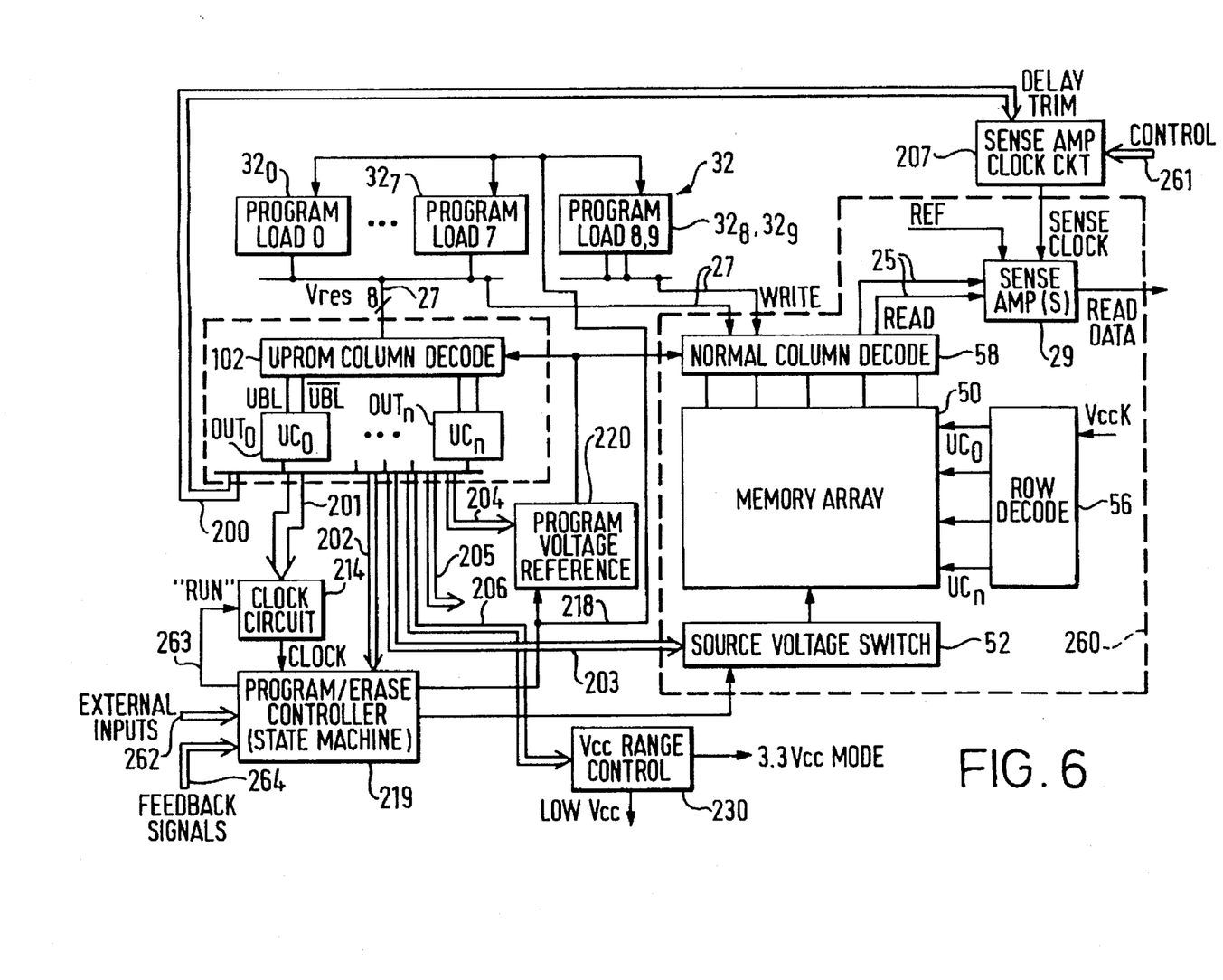
FIG. 6 is a block diagram of circuitry using control signals from the UPROM cells.

FIG. 6 is a block diagram of circuitry associated with a memory circuit exemplifying particular applications of the outputs $OUT_0 \ldots OUT_n$ of the UPROM cells. In FIG. 6, seven sets of outputs are illustrated, 200,201,202,203,204, 205,206. The output signals $OUT_0 \ldots OUT_n$ correspond to the outputs illustrated in FIG. 3 and FIG. 5. Thus, each output comes from the respective multiplexor 98 of the appropriate UPROM cell $UC_0 \ldots UC_n$. In a test mode, the outputs represent test data bits stored in the latch 96. In a normal mode, the outputs represent data bits stored in the UPROM element 94. Reference numeral 260 denotes a memory circuit of the general type illustrated in FIG. 2. As described above with reference to FIG. 2, the memory circuit includes a column decode circuit 58, a row decode circuit 56, a source voltage switch 52 and a sense amplifier 29. The sense amplifier is a dynamic sense amplifier and is controlled by a sense clock signal supplied from a sense amplifier clock circuit 207. The programmable load 32 for supplying programming signals to the memory array 50 via the column decode circuit 58 comprises a plurality of programmable load circuits $32_0 \ldots 32_7$ and $32_8, 32_9$. The first set of programmable load circuits $32_0 \ldots 32_7$ supplies programmable load signals to the normal memory array 50 of the memory circuit 260 and also to the column decode circuit 102 for the UPROM cells $UC_0 \ldots UC_n$. The second set of programmable load circuits $32_8, 32_9$ supply programming signals only to the memory array 50 of the memory circuit 260. The programming signals supplied by the programmable load circuits $32_0 \ldots 32_9$ are controlled by a program/erase controller 219 which takes the form of a state machine. The program/erase controller 219 also controls a program voltage reference circuit 220 which supplies a voltage reference for the column decode circuits 58,102. The program/erase controller 219 also controls the source voltage switch 52. Reference numeral 264 denotes feedback signals from other on-chip circuits, e.g. low Vcc detect. Reference numeral 262 denotes external signals from external circuits for implementing operations of the controller 219. A clock signal controls the timing of the program/erase controller. The clock signal is supplied by a clock circuit 214 while the controller 219 is activated, responsive to the signal Run on line 263. The integrated circuit also includes a supply voltage range control circuit 230 which can be programmed to implement a 5 V mode, a 3.3 V mode or to determine whether the supply voltage is 5 V or 3.3 V. It further generates a low power supply voltage signal, LOWVcc, when the power supply dips below a low level.

The program/erase controller circuit 219 supplies program control signals 218 for controlling the programming signals for programming the FLASH array 50 and also the UPROM cells after a satisfactory test has been completed. The program voltage reference circuit 220 and the programmable load circuits $32_0 \ldots 32_7$ are controlled by the program/erase controller circuit 219. In the embodiment of FIG. 6, operation of the program/erase controller circuit is affected by the second and third sets of outputs, 201,202 from the UPROM cells. Further, the voltage supplied by the program voltage reference circuit 220 is affected by the fifth set of outputs 204. The advantages of the invention in the context of this arrangement are discussed later.

The first set of outputs 200 from the UPROM cells control timing of the sense amplifier clock circuit 207 by providing a delay trim signal. Thus, the timing of the sense amplifier 29 can be first tested using test data bits stored in the latches 96 and then programmed into the UPROM elements when the timing is satisfactory. Reference numeral 261 denotes control signals used for controlling the sense amplifier clock circuit for starting a read operation.

The second set of outputs 201 from the UPROM cells provide a frequency trim signal to the clock circuit 214 for adjusting the frequency of the clock signal supplied to the program/erase controller 219. The third set of outputs 202 control functional options for the program/erase controller 219, for example to determine whether or not the state machine will accept CPU or embedded program/erase commands, as discussed above.

The fourth set of outputs 203 controls the source voltage switch 52 to trim the resistance through which the analogue voltage is supplied by the source voltage switch. The fifth set of outputs 204 controls the program voltage reference circuit 220 to trim the analogue voltage supplied as a program voltage reference to the column decode circuits 58,102.

The seventh set of outputs 206 control the Vcc range control circuit 230 to program the circuit to operate at a nominal supply voltage Vcc of 5 V, 3.3 V or in an autodetect mode which will work for both.

The sixth set of outputs 205 are used for optional functionality of the memory circuit 206.

In FIG. 6, the plurality of programmable load circuits are divided into first and second sets. As already described, the first set of programmable load circuits supplies programmable load signals to the normal memory array and the UPROM cells while the second set of programmable load circuits supplies programming signals only to the memory array of the memory circuit. In a modification to this aspect of the embodiment shown in FIG. 6, a first set of programmable load circuits is connected only to the respective UPROM cells UC and a second set of programmable load circuits is connected only to the memory array. A further alternative arrangement of the programmable load circuits has a first set of programmable load circuits connected to the UPROM cells UC as well as to the memory array. A second set of programmable load circuits is connected only to the UPROM cells UC.

The present invention has a particular advantage where some of the outputs from the UPROM cells (in this case sets 201,202,204) are used to modify programming signals used for programming the UPROM cells. That is, respective sets of test data bits can be loaded into the latches 96 and used to generate the output sets 201,202,204 for the clock circuit 214, program/erase controller circuit 219 and program voltage reference circuit 220. This allows optimisation of the programming settings for programming the UPROM elements, without having had to program the UPROM elements already. Without a latch associated with each UPROM element in the manner of the present invention, it would not be possible to achieve this. That is, the only way to load a desired set of option bits would be to program them into the UPROM elements but, as discussed above, programming the UPROM elements would be very difficult without having selected the necessary programming signals. Moreover, it is possible to load a different set of option bits into the latches from the bits which are finally required to be programmed into the UPROM elements. Thus, flexibility is available by providing a latch associated respectively with each UPROM element, the output of which affects programming signals for the UPROM elements.

Referring back to FIG. 5, the latch 96 receives data bits on the line marked DATA and is controlled by a LOAD LATCH signal. The multiplexor 98 is controlled by a USE LATCH signal.

In normal use of the memory, the multiplexor 98 is set so that the output signal OUT comes from the UPROM element 94. However, in test mode the signal USE LATCH which controls the multiplexor can be activated so that the output signal OUT comes from the latch 96 instead of from the UPROM element 94. In this test mode, when USE LATCH is set, the memory can be tested in accordance with a test data bit in the latch 96. If the test of the memory is not satisfactory, the test data bit in the latch 96 is changed and a second test is run. When the results of the test are satisfactory in this test mode, the UPROM elements 94 can be programmed in accordance with the test data bit which was stored in the latch 96 when the successful test result was gained. Programming of the UPROM element 94 is done in a known manner as already discussed.

It will readily be apparent that for some option bits, it is not always necessary to run a satisfactory test and then program the bits. It would be possible for example to run a test using test data bits stored in the latches 96 and then to extrapolate from the results of the test the required option bits to be programmed in the UPROM elements 94. Thus, a "satisfactory test" is either one which determines the accuracy of the test data bits which have actually been used in the test, or one which allows the results of the test to be used to determine required option bits.

Loading of the test data bit into the latch 96 is done in another test mode in which the signal LOAD LATCH is activated. In this mode, the test data bit is loaded into the latch 96 on the data line DATA.

It will readily be appreciated that with a plurality of UPROM cells in parallel, several outputs can be supplied for testing various options of memory conditions. In the described implementation, it is likely that a number of latches 96 will be loaded simultaneously.

The method of using the memory described herein will now be described. Firstly, the test mode to load the desired test data bits into the latches is selected by setting the LOAD LATCH signal. In this test mode, test data bits are loaded into the latches along the data lines DATA. The test mode is then selected which causes the bits held in the latches 96 to be output by the multiplexor 98 by setting the USE LATCH signal. Normal memory operations (including other test modes) can then be carried out while this test mode remains active, that is using the test data bits stored in the latches 96. Later in the test flow, when satisfactory test data bits have been established, the UPROM elements can finally be programmed with these test data bits. The LOAD LATCH test mode is then released so that the outputs OUT are taken from the UPROM elements for normal use.

The LOAD LATCH test mode and the USE LATCH test mode can be selected in any known fashion, for example by holding an input pin at a superhigh voltage.

Although the invention has been described with reference to a flash memory, it will be appreciated that the invention can be applied to any circuit which includes storage elements which cannot be reprogrammed or which are hard to reprogram. Thus, it could be used in other types of memory circuits, including SRAMs (static random access memories). Furthermore, it could be used in circuits where laser fuses are used as the non-reprogrammable storage elements.

What is claimed is:

1. An integrated circuit device comprising:
   functional circuitry controllable in response to control signals;
   a plurality of storage elements which are not reprogrammable or which are slow to reprogram;
   a set of latches, associated with a set of the plurality of storage elements, each latch being associated with a respective storage element in said set of the plurality of storage elements, said set of latches for holding respective test data bits; and
   a set of switch circuits, each switch circuit connected to a respective one of said set of storage elements and to its associated latch and selectively operable to supply as an output a signal from one of the storage element and the latch with which it is associated, whereby, in use in a test mode, the latches hold test data bits for testing the device, the switch circuits being operable to supply said control signals from said test data bits and, in use in a normal mode, the switch circuits are operated to supply said control signals from said storage elements;
   wherein said functional circuitry includes programming circuitry to program the storage elements.

2. An integrated circuit device according to claim 1 wherein said functional circuitry includes an array of reprogrammable memory cells.

3. An integrated circuit device according to claim 2 wherein each reprogrammable memory cell is a single floating gate transistor which is electrically reprogrammable.

4. An integrated circuit device according to claim 1, 2 or 3 wherein the storage elements are electrically programmable memory elements.

5. An integrated circuit device according to claim 2 or 3 wherein the programming circuitry includes a circuit to program the reprogrammable memory cells.

6. An integrated circuit device according to claim 5 wherein the programming circuitry includes:
   a plurality of programmable load circuits to supply programming signals; and
   a program controller circuit responsive to said control signals to determine the programming signals to be supplied by the programmable load circuits.

7. An integrated circuit device according to claim 6 wherein a first set of said plurality of programmable load circuits is arranged to supply programming signals to the storage elements and to the reprogrammable memory cells, and a second set of said programmable load circuits is arranged to supply programming signals only to the reprogrammable memory cells.

8. An integrated circuit device according to claim 6 wherein a first set of said plurality of programmable load circuits is arranged to supply programming signals only to the reprogrammable memory cells, and a second set of said programmable load circuits is arranged to supply programming signals only to the storage elements.

9. An integrated circuit device according to claim 6 wherein a first set of said plurality of programmable load circuits is arranged to supply programing signals to the storage elements and to the reprogrammable memory cells, and a second set of said programmable load circuits is arranged to supply programming signals only to the storage elements.

10. An integrated circuit device according to claim 6, wherein the functional circuitry includes clock circuitry for supplying a clock signal for operation of the program control circuit, the frequency of the clock signal being controlled by the control signals.

11. An integrated circuit device according to claim 1, wherein the functional circuitry includes voltage supply circuitry for supplying an appropriate analog voltage for operation of the integrated circuit device, the analog voltage being determined by the control signals.

12. An integrated circuit device according to claim 11 wherein the functional circuitry includes an array of memory cells, each memory cell comprising a reprogrammable transistor having a drain, a gate and a source.

13. An integrated circuit device according to claim 12 wherein the voltage supply circuitry comprises a source voltage switch for selectively supplying an appropriate voltage to the sources of said transistors.

14. An integrated circuit device according to claim 12 wherein the voltage supply circuitry comprises a programming voltage reference circuit to selectively supply a reference voltage for programming.

15. The circuit of claim 1, wherein said set of the plurality of storage elements includes each storage element of said plurality of storage elements.

16. A method of testing an integrated circuit device comprising functional circuitry controllable in response to control signals and a plurality of storage elements which are not programmable or which are slow to reprogram, the method comprising:
   loading test data bits respectively into each of a set of latches, each latch being associated with a respective one of the plurality of storage elements;
   selecting a test mode in which the outputs of the latches provide the control signals for testing the memory;
   on completion of a satisfactory test, programming the storage elements in accordance with the test data bits which were held in the latches during the satisfactory test; and
   selecting a normal mode of operation in which the storage elements provide the control signals, wherein the functional circuitry includes programming circuitry for programming the storage elements.

17. A method according to claim 16 when used to test a memory comprising a plurality of reprogrammable memory cells.

18. A method according to claim 16 or 17 wherein the control signals are used to select an analogue voltage for the integrated circuit device.

19. A method according to claim 16 or 17 wherein the control signals are used to control a clock frequency for the integrated circuit device.

20. A memory comprising:

a first plurality of reprogrammable memory cells;

a second plurality of electrically reprogrammable memory cells which are slow to reprogram relative to the reprogrammable memory cells;

a set of latches, associated with a set of said second plurality of memory cells, each latch in the set being associated with a respective memory cell in said set of the second plurality of memory cells;

a set of switch circuits, each switch circuit connected to a respective one of said set of memory cells and to its associated latch and selectively operable to supply as an output a signal from one of the memory cell and the latch to which it is connected whereby, in use in a test mode, the latches hold test data bits for testing the memory and the switch circuits output said test data bits and, in use in a normal mode, the switch circuits output data bits from said set of memory cells.

21. A memory according to claim 20 which comprises programming circuitry for the second plurality of memory cells, wherein the data bits are used to control said programming circuitry.

22. A memory according to claim 20 or 21 wherein the data bits are used to select an analog voltage for the memory.

23. A memory according to claim 20 or 21 wherein the data bits are used to select a clock frequency for operation of the memory.

24. The circuit of claim 20, wherein said set of said second plurality of memory cells includes each memory cell of said second plurality of memory cells.

25. A method of testing a memory comprising a first plurality of reprogrammable memory cells and a second plurality of electrically reprogrammable memory cells which are slow to reprogram relative to the reprogrammable memory cells, the method comprising:

loading test data bits respectively into each of a set of latches, each latch being associated with a respective one of the second plurality of memory cells;

selecting a test mode in which the outputs of the latches provide the test signal outputs for testing the memory;

on completion of a satisfactory test, programming a second plurality of memory cells with the test data bits which were held in the latches during the satisfactory test; and selecting a normal mode of operation in which the outputs of the second plurality of memory cells provide control signals for the memory.

26. An integrated circuit device, the integrated circuit comprising:

a first plurality of storage elements;

a second plurality of storage elements;

a functional circuit, operable in response to a plurality of control signals, that includes a programming circuit to store data in the first plurality of storage elements; and a switch having a first input coupled to the first plurality of storage elements, a second input coupled to the second plurality of storage elements and an output to provide, during a first mode of operation, data stored in the first plurality of storage elements as the control signals and to provide, during a second mode of operation, data stored in the second plurality of storage elements as the control signals.

27. An integrated circuit device, the integrated circuit comprising:

a first plurality of storage elements;

a second plurality of reprogrammable storage elements which are slow to reprogram;

a third plurality of storage elements, each of which is associated with at least one of the reprogrammable storage elements of the second plurality of reprogrammable storage elements; and a switch having a first input coupled to the first plurality of storage elements, a second input coupled to the second plurality of storage elements and an output to provide, during a first mode of operation, data stored in the first plurality of storage elements and to provide, during a second mode of operation, data stored in the second plurality of storage elements.

* * * * *